US007541995B1

(12) United States Patent
Murphy, Jr.

(10) Patent No.: US 7,541,995 B1
(45) Date of Patent: Jun. 2, 2009

(54) ELECTROMAGNETIC SIGNAL PROXIMITY DETECTION SYSTEMS AND METHODS

(75) Inventor: John J. Murphy, Jr., Poway, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 147 days.

(21) Appl. No.: 11/860,734

(22) Filed: Sep. 25, 2007

(51) Int. Cl.
*G01R 29/10* (2006.01)
*H01Q 3/00* (2006.01)
*H01Q 21/00* (2006.01)

(52) U.S. Cl. ........................ 343/703; 343/766; 343/893

(58) Field of Classification Search ................. 343/703, 343/757, 766, 893
See application file for complete search history.

(56) References Cited

U.S. PATENT DOCUMENTS 4,477,812 A * 10/1984 Frisbee et al. ............... 342/417
5,945,948 A * 8/1999 Buford et al. ............... 342/457
6,078,279 A * 6/2000 Oliva .......................... 342/20
2007/0052576 A1 3/2007 Hausner et al.
2007/0069732 A1 3/2007 Mercer
2007/0194923 A1 8/2007 Karr

* cited by examiner

*Primary Examiner*—Shih-Chao Chen
(74) *Attorney, Agent, or Firm*—Ryan J. Friedl; Kyle Eppele

(57) ABSTRACT

Various methods and systems directed to electromagnetic signal proximity detection are disclosed. For example, an EM detector may include an antenna array for sensing electromagnetic radiation produced by a source of radio-frequency electromagnetic radiation, one or more amplitude demodulation circuits coupled to the antenna array configured to perform an amplitude demodulation of one or more signals provided by the antenna array to produce one or more respective demodulated output signals, and an analysis circuit coupled to the amplitude demodulation circuit configured to determine at least one relative characteristic between the antenna array and the source of radio-frequency electromagnetic radiation. The relative characteristic may be the relative distance and/or angle between the antenna array and the source of radio-frequency electromagnetic radiation. The embodiments allow for signal source detection and location determination without knowledge of the frequency of a target emitter.

20 Claims, 3 Drawing Sheets

ELECTROMAGNETIC SIGNAL PROXIMITY DETECTION SYSTEMS AND METHODS

FEDERALLY-SPONSORED RESEARCH AND DEVELOPMENT

The Electromagnetic Signal Proximity Detection Systems and Methods were developed with Federal funds and are assigned to the United States Government. Licensing inquiries may be directed to the Office of Research and Technical Applications, Space and Naval Warfare Systems Center, San Diego, Code 20012, San Diego, Calif., 92152; telephone 619-553-2778; email: T2@spawar.navy.mil.

BACKGROUND

I. Field

The following description relates generally to the detection of sources of electromagnetic radiation.

II. Background

Small transmitters of radio-frequency electromagnetic (EM) energy, such as concealed electronic "bugs" and misplaced cellular phones, are often the subject for intensive searches. Accordingly, a number of technologies to detect such objects have been developed.

For example, a technology known as time difference of arrival (TDOA) of an EM signal uses a plurality of receiving locations to triangulate the bearing of the EM signal source.

A second technology, known as pseudo-Doppler, uses a multiple antenna array where the antennas are electronically switched in a simulated circular pattern to produce a simulated Doppler phase shift on the carrier frequency of the EM signal. The Doppler shift is a maximum when the velocity of the antenna is orthogonal to the wave front of the EM signal, and zero when the velocity vector of the antenna is parallel to the wave front.

A third technology, known as Watson-Watt Direction finding, is based on the directivity pattern of a multiple antenna array. The outputs of several antennas are processed vectorially to obtain an output proportional to the angle of arrival of the EM signal wave front at the antenna array.

While the above-mentioned technologies are useful, they all suffer from a number of shortcomings. For example, TDOA requires precise knowledge of the EM signal frequency, and fails when the EM signal source is physically close to the receiving system. Pseudo-Doppler and Watson-Watt techniques also require knowledge of the target signal frequency. Pseudo-Doppler similarly becomes inaccurate when its receiving antenna array is close to the EM signal source, and Watson-Watt direction finding requires highly complex and expensive processing equipment. Accordingly, new technology for the location of EM signal sources is desirable.

SUMMARY

Various aspects and embodiments of the invention are described in further detail below noting that in a variety of embodiments the present disclosure allows for signal source detection and location techniques that do not require knowledge of the frequency of a target emitter.

In an embodiment, an electromagnetic signal proximity detector for detecting the presence of a source of radio frequency electromagnetic radiation includes an antenna array that includes one or more antennas for sensing electromagnetic radiation produced by a first source, the antenna array being configured to move by using at least one of a physical or virtual operation, one or more amplitude demodulation circuits coupled to the antenna array configured to perform an amplitude demodulation on one or more signals provided by the antenna array to produce one or more respective demodulated output signals, the one or more demodulated output signals each being representative of a signal strength of the sensed electromagnetic radiation received by the antenna array, and an analysis circuit coupled to the amplitude demodulation circuit configured to determine at least one of a relative distance and a relative angle of the antenna array and source.

In another embodiment, an electromagnetic signal proximity detector for detecting the presence of a source of radio frequency electromagnetic radiation includes a sensing means for sensing electromagnetic radiation produced by a first source, an amplitude demodulation means coupled to the sensing means for performing an amplitude demodulation on one or more signals provided by the antenna array to produce one or more respective demodulated output signals, the one or more demodulated output signals each being representative of a signal strength of the sensed electromagnetic radiation received by the sensing means, and an analysis means coupled to the amplitude demodulation means for determining both a relative distance between the sensing means and source.

In yet another embodiment, a method for detecting the presence of a source of radio frequency electromagnetic radiation includes sensing electromagnetic radiation produced by a first source using an antenna array that includes one or more antennas for sensing electromagnetic radiation produced by a first source, the antenna array being configured to move by using at least one of a physical or virtual operation, performing an amplitude demodulation process on one or more signals provided by the one or more antennas to produce one or more respective demodulated output signals, the one or more demodulated output signals being representative of the sensed electromagnetic radiation received by the antenna array, and analyzing the one or more respective demodulated output signals to determine a relative distance of the antenna array and the source.

BRIEF DESCRIPTION OF THE DRAWINGS

The features and nature of the present disclosure will become more apparent from the detailed description set forth below when taken in conjunction with the accompanying drawings in which reference characters identify corresponding items.

DETAILED DESCRIPTION

The disclosed methods and systems below may be described generally, as well as in terms of specific examples and/or specific embodiments. For instances where references are made to detailed examples and/or embodiments, it should be appreciated that any of the underlying principals described are not to be limited to a single embodiment, but may be expanded for use with any of the other methods and systems described herein as will be understood by one of ordinary skill in the art unless otherwise stated specifically.

Figure 1:
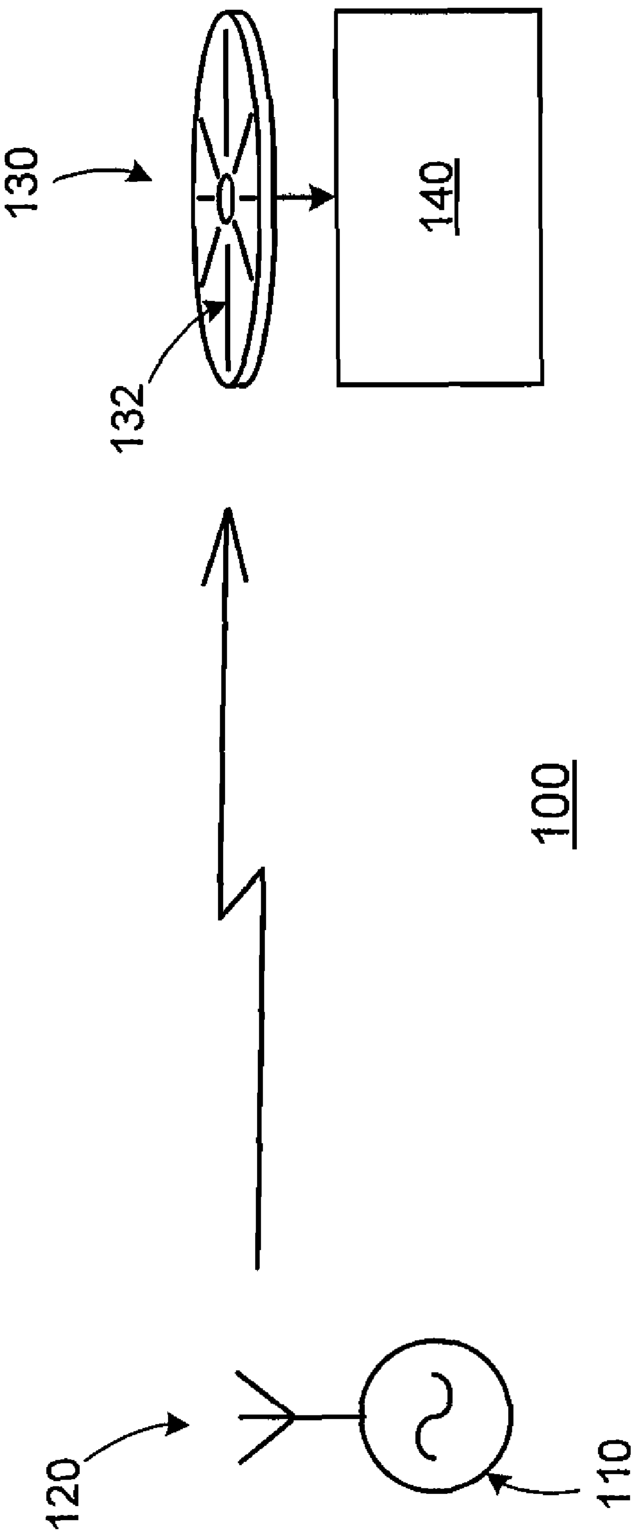
FIG. 1 depicts an exemplary detection system in context with a source of electromagnetic energy.

FIG. 1 depicts an exemplary detection system 100. As shown in FIG. 1 exemplary detection system 100 includes an electromagnetic (EM) energy source 110 with an accompanying source antenna 120, and an EM energy detection module 140 coupled to a respective antenna array 130 having a plurality of antennas 132. For the present example of FIG. 1, the antennas 132 have a radial configuration with respect to one another.

In operation, the electromagnetic energy source 110 can emit a radio-wave EM signal via its respective antenna 120. Generally, such a radio-wave EM signal may be omni-directional and may dissipate according to Eq. (1) below:

$$Y=10\log(R^{-N}), \quad \text{Eq (1)}$$

where Y is the energy at distance R from antenna 120, and N is a number ranging from about 2.0 (for intermediate to close distances, e.g., from about 1 meter to about 1,000 meters) to about 3.0 (for very close distances, e.g., less than 1 meter).

As EM energy propagates from the source 110 to antenna array 130, the antenna array 130 can sense/absorb the EM energy, and transfer the sensed/absorbed EM energy to the EM detection module 140, which may then perform a variety of novel combinations of processes to determine the relative distance and/or angle between the source 110 and the detection module 140 (assuming that the antenna 120 and antenna array 130 are respectively co-located with the EM source 110 and the EM detection module 140).

While the exemplary antenna array 130 includes a radial configuration of eight separate antennas 132 each having a length that may vary considerably with respect to the wavelength of the EM radiation produced by source 110, it should be appreciated that a large variety of antenna configurations may be used with each configuration having different advantages and disadvantages.

For example, in a particular series of embodiments, antenna array 130 may include a single antenna configured to move by physical rotation. In such embodiments, antenna array 130 may be physically rotated about a central axis. Regardless of the nature of the antenna or signal frequency, it should be appreciated that (assuming an inverse square law propagation (N=2)) a change in 1 foot (~⅓ meter) distance between the antenna and source 110 at a total distance of about ten feet (~3.3 meters) may result in a change of power of about 21% (~0.8 db).

Note that the receiving antenna 130 does not need to be resonant (e.g., ¼ wavelength), and it should be appreciated that, in a number of embodiments, a broadband antenna may be useful since the signal frequency is assumed to be unknown. Such embodiments can be especially useful for real-world situations where there is no precise knowledge of the signal frequency.

In another series of embodiments, antenna array 130 may be configured to include a dual antenna configured to move by physical rotation. In such embodiments, both antennas may be rotated about a central axis and may produce a differential signal that may provide improved sensing as compared to a single antenna configuration. While an increased number of rotating antennas may be used, the resulting advantages as compared to one or two rotating antennas may be less prominent, but advantages and disadvantages may be weighted according to the particular circumstances from embodiment to embodiment.

As opposed to using a physically rotating array of antennas, it may also be beneficial to use an antenna array 130 of "virtually" rotating antennas. For example, by using a set of 16 radially-oriented antennas each oriented at a constant angle of 22.5° from their nearest neighbors, and multiplexing, through use of a multiplexer such as multiplexer 210 (see FIG. 2), the signals as a function of angle, an effective rotating antenna may be produced. As with the physically rotating antennas, a pair of dual rotating antennas may be realized to produce a differential output signal by using two 16-to-1 multiplexers having a 180° phase relationship with respect to one another. As each antenna 132 of antenna array 130 may sense/absorb EM energy from the source 110, such energy can be provided to the detection module 140, where it may be processed according to a number of techniques, such as those discussed below with respect to FIGS. 2 and 3. For example, multiplexer 210, which may include one or more multiplexing circuits, may provide a differential signal to an amplitude demodulator 220, which may include one or more amplitude demodulation circuits.

Figure 2:
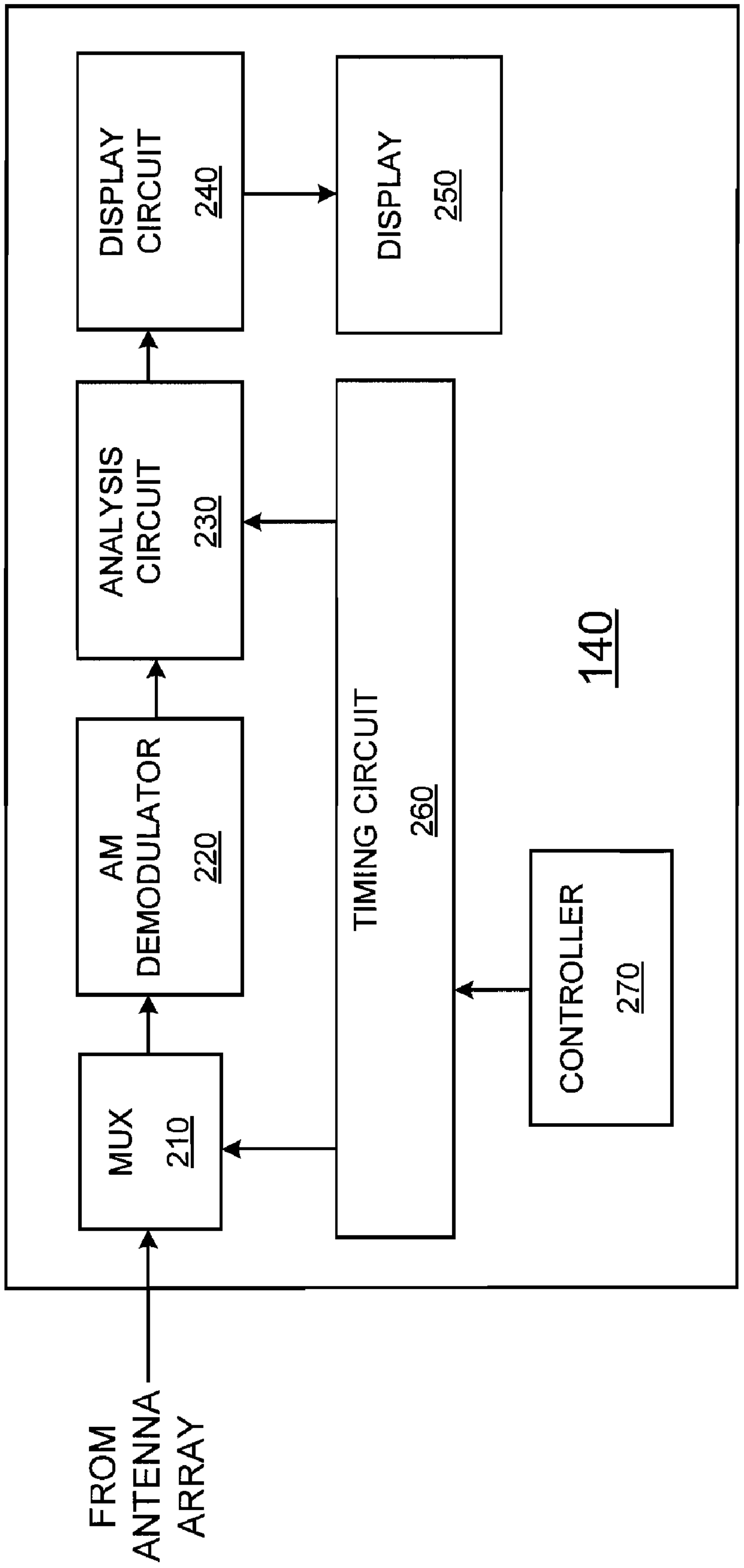
FIG. 2 depicts details of the exemplary detection module of FIG. 1.

FIG. 2 depicts the exemplary detection module 140 of FIG. 1. As shown in FIG. 2, the detection module 140 includes a multiplexer 210, an AM demodulator 220, an analysis circuit 230, a display circuit 240 with display 250, a timing circuit 260 and a controller 270. While the exemplary components 210-270 are shown as an interconnected collection of functional components, in various alternative embodiments components 210-270 may interact using a variety of other architectures, such as a system using a single data/timing bus. Further, some of the components may take the form of software modules located in a computer-readable memory to be operated upon by a processor, such as controller 270 or a similar device.

In operation of a first series of embodiments (virtual rotation), the multiplexer 210 can receive a plurality of EM signals sensed/absorbed by the various antennas of an antenna array, and under control of timing circuit 260, which may be operatively connected to analysis circuit 230, multiplex them into a single signal. For example, multiplexer 210 can receive signals from 32 separate antennas arranged in a radial pattern, and multiplex the signals to simulate a single virtually rotating antenna.

In operation of a second series of embodiments (virtual rotation), multiplexer 210 can receive a plurality of EM signals sensed/absorbed by the various antennas of an antenna array, and multiplex them into a two separate, complementary signals. For example, multiplexer 210 may receive the 32 signals as before, and multiplex the signals to simulate two virtually rotating antennas separated by a 180 degree angle.

In operation of a third series of embodiments (physical rotation), the multiplexer 210 may be eliminated and/or simply pass any received signals sensed/absorbed by a rotating antenna array to provide a single output, a dual/complementary output or an output having even more separate signals from more rotating antennas.

It should be appreciated that, in the various embodiments described above, the signal(s) provided to the AM demodulator 220 may have the general appearance of a sinusoid modulated according to the carrier frequency of the EM source. For example, if the signal source has a 2.4 GHz carrier and the antenna array effectively rotates at 100 Hz, the input signal(s) to the AM demodulator 220 may appear as an AM modulated sinusoid(s) having period of 0.01 seconds and modulated on a 2.4 GHz carrier.

As the (physically or virtually) rotating antenna signals are passed to the AM demodulator 220, the AM demodulator 220 can provide any number of operations associated with AM demodulators, such as buffering/amplifying of the received signal(s), providing band-pass filtering, mixing/heterodyning and so on, to provide one or more demodulated output signal, e.g., one output signal for a single rotating antenna, two output signals for a dual/complementary antenna array, and so on. Once demodulated baseband (or low-frequency) output signal(s), the output(s) of the AM demodulator 220 may be provided to the analysis circuit 230.

In turn, analysis circuit 230 may apply a number of processes to the demodulated signals to estimate a relative characteristic between the antenna array and the source of radio-frequency electromagnetic radiation. The relative characteristics may include relative distance between the antenna array and a source of EM radiation and also may include the relative angle between the antenna array and the source of EM radiation. In some embodiments, analysis circuit 230 may estimate either of the relative distance or relative angle, while in other embodiments analysis circuit 230 may estimate both the relative distance and relative angle.

As an example, assuming that the analysis circuit 230 is operating on a demodulated sinusoidal signal, distance may be estimated by using the difference of the apex and nadir of the sinusoidal signal and applying Eq. (1) above, while relative angle may be determined by comparing the apex of the sinusoidal signal to timing information provided by the timing circuit 260. In some embodiments, analysis circuit 230 may be configured to determine the relative distance between antenna array 130 and source 110 based on a logarithm of the inverse square of the signal strength of the one or more respective demodulated output signals. In other embodiments, analysis circuit 230 may be configured to determine the relative distance of antenna array 130 and source 110 based on a logarithm of the inverse cube of the signal strength of the one or more respective demodulated output signals. Further, in other embodiments, analysis circuit 230 may be configured to determine the relative distance between antenna array 130 and source 110 based on a logarithm of the inverse Nth power of the signal strength of the one or more respective demodulated output signals, wherein N is a real number varying from about 2.0 to about 3.0.

It should be appreciated that, in various embodiments, the analysis circuit may employ a number of techniques, such as signal averaging and correlation over multiple periods, to improve results. As the analysis circuit 230 performs its various estimations, the analysis circuit 230 can feed the resultant information to the display circuit 240 and display 250, such that a human operator may easily interpret the results of the analysis circuit 230.

Figure 3:
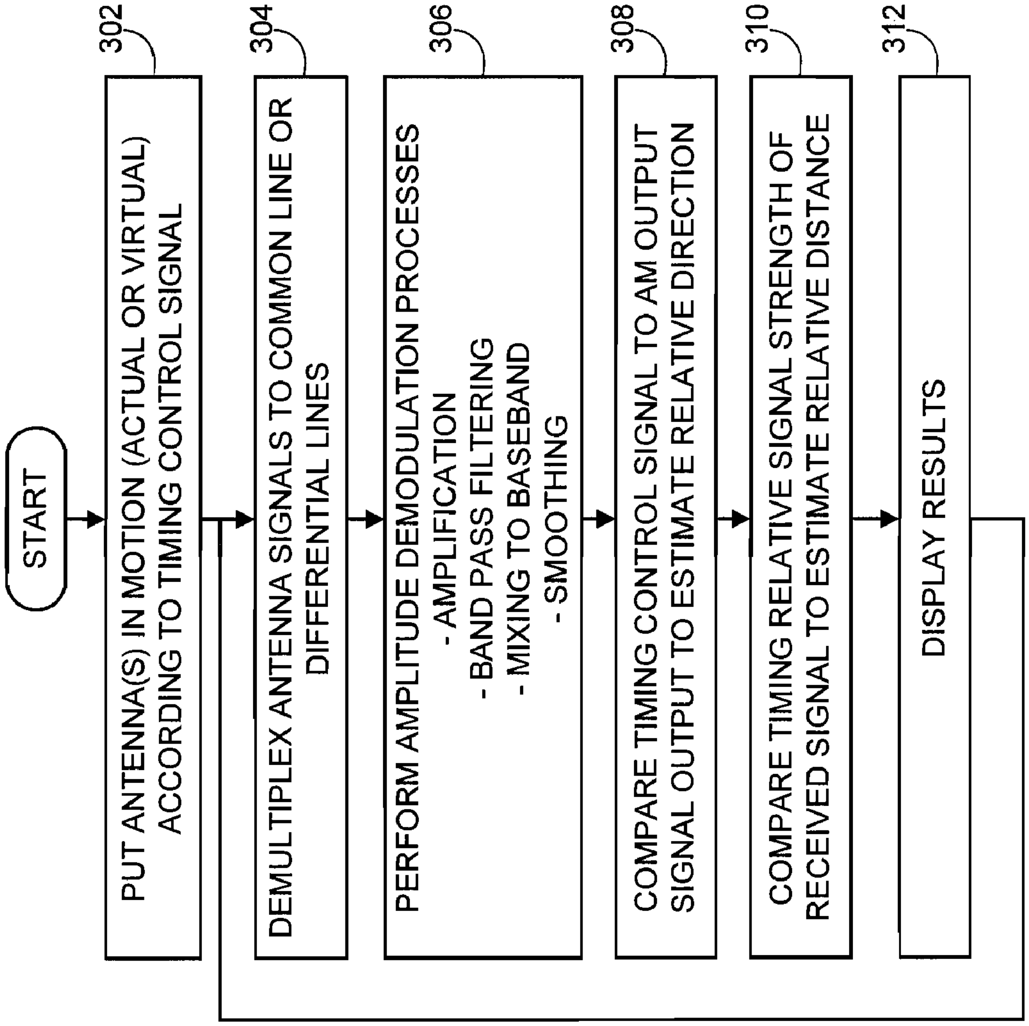
FIG. 3 is a flowchart outlining a number of exemplary processes according to the disclosed methods and systems.

FIG. 3 is a flowchart outlining a number of exemplary processes according to the disclosed methods and systems. The process starts in step 302 where an antenna array is put in (physical or virtual) motion. While a radial configuration of one or more rotating antennas may be highly useful, it should be appreciated that in other embodiments other configurations may be used. For example, instead of scanning 360 degrees, a virtual antenna of 32 antennas may be made to rotate back and forth about 4-6 antennas to scan only those angles providing the strongest and weakest signals of interest. Control continues to step 304.

In step 304, assuming a non-physically rotating antenna array is used, sensed signals from the antennas may be multiplexed to create virtual rotation or scanning; otherwise for physically rotating antenna(s), no multiplexing may be required and this step may be skipped. Next, in step 306, the (physically or virtually) rotating antenna signals may be demodulated using any number of processes useful for AM demodulation. Control continues to step 308.

In step 308, the demodulated signals from step 306 may be used to estimate relative the relative angle of direction. The relative angle between antenna array 130 and the source of EM radiation 110 may be estimated as described above with respect to FIG. 2. Next, in step 310 the demodulated signals from step 306 may be used to estimate relative distance. The relative distance between antenna array 130 and the source of EM radiation 110 may be estimated as described above with respect to FIG. 2. Then, in step 312, the results of steps 308 and/or 310 may be displayed to a human operator or otherwise provided to an external data collection agent. The method may then proceed to step 304, where further processing of received EM signals may continue as needed.

In various embodiments where the above-described systems and/or methods are implemented using a programmable device, such as a computer-based system or programmable logic, it should be appreciated that the above-described systems and methods can be implemented using any of various known or later developed programming languages, such as "C", "C++", "FORTRAN", Pascal", "VHDL" and the like.

Accordingly, various storage media, such as magnetic computer disks, optical disks, electronic memories and the like, can be prepared that can contain information that can direct a device, such as a computer, to implement the above-described systems and/or methods. Once an appropriate device has access to the information and programs contained on the storage media, the storage media can provide the information and programs to the device, thus enabling the device to perform the above-described systems and/or methods.

For example, if a computer disk containing appropriate materials, such as a source file, an object file, an executable file or the like, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods related to communications.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An electromagnetic signal proximity detector comprising:

an antenna array including one or more antennas for sensing electromagnetic radiation produced by a source of radio-frequency electromagnetic radiation;

one or more amplitude demodulation circuits coupled to the antenna array, the one or more amplitude demodulation circuits configured to perform an amplitude demodulation on one or more signals provided by the antenna array, the one or more amplitude demodulation circuits producing one or more respective demodulated output signals each representative of a signal strength of the sensed electromagnetic radiation received by the antenna array; and an analysis circuit coupled to the amplitude demodulation circuit, the analysis circuit configured to determine at least one relative characteristic between the antenna array and the source of radio-frequency electromagnetic radiation.

2. The electromagnetic signal proximity detector of claim 1, wherein the relative characteristic is the relative distance between the antenna array and the source of radio-frequency electromagnetic radiation.

3. The electromagnetic signal proximity detector of claim 2, wherein the analysis circuit is configured to determine the relative distance between the antenna array and the source of radio-frequency electromagnetic radiation based on a logarithm of the inverse square of the signal strength of the one or more respective demodulated output signals.

4. The electromagnetic signal proximity detector of claim 2, wherein the analysis circuit is configured to determine the relative distance of the antenna array and the source of radio-frequency electromagnetic radiation based on a logarithm of the inverse cube of the signal strength of the one or more respective demodulated output signals.

5. The electromagnetic signal proximity detector of claim 2, wherein the analysis circuit is configured to determine the relative distance between the antenna array and the source of radio-frequency electromagnetic radiation based on a logarithm of the inverse Nth power of the signal strength of the one or more respective demodulated output signals, wherein N is a number between about 2.0 and about 3.0.

6. The electromagnetic signal proximity detector of claim 5, wherein the analysis circuit is further configured to determine the relative angle between the antenna array and the source of radio-frequency electromagnetic radiation.

7. The electromagnetic signal proximity detector of claim 1, wherein the analysis circuit is configured to determine the relative angle between the antenna array and the source of radio-frequency electromagnetic radiation.

8. The electromagnetic signal proximity detector of claim 7, wherein the relative angle is determined by comparing the apex of the one or more demodulated output signals to timing information provided by a timing circuit operatively connected to the analysis circuit.

9. The electromagnetic signal proximity detector of claim 1, wherein the antenna array includes a single antenna configured to move by physical rotation.

10. The electromagnetic signal proximity detector of claim 1, wherein the antenna array includes a dual antenna configured to move by physical rotation.

11. The electromagnetic signal proximity detector of claim 1, wherein the antenna array includes a plurality of antennas configured to rotate virtually by means of a multiplexing circuit.

12. The electromagnetic signal proximity detector of claim 11, wherein the multiplexing circuit provides a differential signal to the one or more amplitude demodulation circuits.

13. An electromagnetic signal proximity detector comprising:

an antenna array including one or more antennas for sensing electromagnetic radiation produced by a source of radio-frequency electromagnetic radiation;

an amplitude demodulator coupled to the antenna array configured to perform an amplitude demodulation of one or more signals provided by the antenna array, the amplitude demodulator producing one or more respective demodulated output signals each representative of a signal strength of the sensed electromagnetic radiation received by the antenna array; and an analysis circuit coupled to the amplitude demodulator, the analysis circuit configured to determine the relative distance between the antenna array and the source of radio-frequency electromagnetic radiation and the relative angle between the antenna array and the source of radio-frequency electromagnetic radiation.

14. The electromagnetic signal proximity detector of claim 13, wherein the antenna array includes a dual antenna configured to move by physical rotation.

15. The electromagnetic signal proximity detector of claim 13, wherein the antenna array includes a plurality of antennas configured to rotate virtually by means of a multiplexer, wherein the multiplexer provides a differential signal to the amplitude demodulator.

16. The electromagnetic signal proximity detector of claim 13, wherein the analysis circuit is configured to determine the relative distance between the antenna array and the source of radio-frequency electromagnetic radiation based on a logarithm of the inverse Nth power of the signal strength of the one or more respective demodulated output signals, where N is a real number between about 2.0 and about 3.0.

17. A method for detecting the presence of a source of radio-frequency electromagnetic radiation, comprising:

sensing electromagnetic radiation produced by a source using an antenna array including one or more antennas for sensing electromagnetic radiation produced by the source of radio-frequency electromagnetic radiation;

performing an amplitude demodulation process on one or more signals provided by the antenna array to produce one or more respective demodulated output signals each representative of a signal strength of the sensed electromagnetic radiation received by the antenna array; and analyzing the one or more respective demodulated output signals to determine a relative distance between the antenna array and the source of radio-frequency electromagnetic radiation.

18. The method for detecting the presence of a source of radio-frequency electromagnetic radiation of claim 17, wherein the step of analyzing the one or more respective demodulated output signals is performed based on a logarithm of the inverse Nth power of the signal strength of the one or more respective demodulated output signals, wherein N is a number between about 2.0 and about 3.0.

19. The method for detecting the presence of a source of radio-frequency electromagnetic radiation of claim 17, wherein the antenna array includes a plurality of antennas configured to rotate virtually.

20. The method for detecting the presence of a source of radio-frequency electromagnetic radiation of claim 17, wherein the step of analyzing the one or more respective demodulated output signals includes the step of determining a relative angle between the sensing means and the source of radio-frequency electromagnetic radiation based on the one or more respective demodulated output signals.

* * * * *